United States Patent [19]

Gehring et al.

[11] Patent Number: 4,806,882
[45] Date of Patent: Feb. 21, 1989

[54] OSCILLATOR/DEMODULATOR CIRCUIT FOR AN INDUCTIVE PROXIMITY SWITCH

[75] Inventors: Gerhard Gehring, Unterhaching; Franz Hödlmayr, Munich, both of Fed. Rep. of Germany

[73] Assignee: Siemens Aktiengesellschaft, Berlin and Munich, Fed. Rep. of Germany

[21] Appl. No.: 876,376

[22] Filed: Jun. 19, 1986

[30] Foreign Application Priority Data

Jun. 20, 1985 [DE] Fed. Rep. of Germany ....... 3522120

[51] Int. Cl.[4] .......................... G01V 3/11; H03B 5/12
[52] U.S. Cl. .................................. 331/65; 331/117 R
[58] Field of Search ................. 331/65, 108 A, 117 R, 331/167, 168; 340/568; 361/180

[56] References Cited

U.S. PATENT DOCUMENTS 3,350,660 10/1967 Engdahl et al. ................. 331/65
4,543,527 9/1985 Schuchmann et al. .......... 331/65 X
4,609,882 9/1986 Gehring et al. ................. 331/65
4,663,542 5/1987 Buck et al. .................. 361/180 X

FOREIGN PATENT DOCUMENTS 0421237 3/1967 Switzerland .

OTHER PUBLICATIONS

Zulauf, "Electronique et Microèlectronique Industrielle", Jun., 1975, pp. 54-56.

Primary Examiner—Eugene R. LaRoche
Assistant Examiner—David Mis
Attorney, Agent, or Firm—Herbert L. Lerner; Laurence A. Greenberg

[57] ABSTRACT

An oscillator/demodulator circuit for an inductive proximity switch includes a transistor amplifier stage having an input circuit and an output circuit, a resonant circuit connected in the input circuit of the transistor amplifier stage, a device for damping the resonant circuit, a device for providing positive feedback from the output circuit to the input circuit of the transistor amplifier stage, a limiter branch connected in the input circuit of the transistor amplifier stage, a dual current mirror active in the input circuit of the transistor amplifier stage having first and second interconnected current mirrors including transistors. It further has a circuit output connected to the current mirrors for receiving currents supplied by the current mirrors being subtracted from each other, the transistors in the second current reflector having a larger emitter area ratio than the transistors in the first current mirror, and a resistance network connected to the oscillator/demodulator circuit output being switchable for providing an adjustable hysteresis.

5 Claims, 5 Drawing Sheets

OSCILLATOR/DEMODULATOR CIRCUIT FOR AN INDUCTIVE PROXIMITY SWITCH

The invention relates to an oscillator/demodulator circuit for an inductive proximity switch, including a transistor amplifier stage having an input circuit and an output circuit, a dampable resonant circuit connected in the input circuit of the transistor amplifier stage, positive feedback from the output circuit to the input circuit of the transistor amplifier stage, a limiter branch connected in the input circuit of the transistor amplifier stage, a dual current mirror active or effective in the input circuit of the transistor amplifier stage having first and second interconnected current mirrors including transistors, and a circuit output connected to the current mirrors for receiving currents supplied by the current mirrors being subtracted from each other, the transistors in the second current mirror having a larger emitter area ratio than the transistors in the first current reflector.

Prior art devices, which will be more fully discussed below, provide means for switching hysteresis by varying the resistance in the emitter circuit of the oscillator transistor. However, in such devices the absolute distance and the relative magnitude of the hysteresis cannot be adjusted independently of each other.

It is accordingly an object of the invention to provide an oscillator/demodulator circuit arrangement for an inductive proximity switch, which overcomes the hereinafore-mentioned disadvantages of the heretofore-known devices of this general type and in which such an independent setting of the two above-mentioned quantities is possible.

With the foregoing and other objects in view there is provided, in accordance with the invention, an oscillator/demodulator circuit for an inductive proximity switch, comprising a transistor amplifier stage having an input circuit and an output circuit, a resonant circuit connected in the input circuit of the transistor amplifier stage, means for damping the resonant circuit, means for providing positive feedback from the output circuit to the input circuit of the transistor amplifier stage, a limiter branch connected in the input circuit of the transistor amplifier stage, a dual current mirror active or effective in the input circuit of the transistor amplifier stags having first and second interconnected current mirrors including transistors, a circuit output connected to the current mirrors for receiving currents supplied by the current reflectors being subtracted from each other, the transistors in the second current mirror having a larger emitter area ratio than the transistors in the first current mirror, and a resistance network connected to the circuit output which can be switched over for providing an adjustable hysteresis.

In accordance with another feature of the invention, there is provided a Schmitt trigger having an input connected to the circuit output and an output connected to the resistance network for switching over the resistance network as a function of an output signal of the Schmitt trigger.

In accordance with a further feature of the invention, there is provided an electronic switch connected to the resistance network for switching over the resistance network.

In accordance with an added feature of the invention there is provided an electronic switch connected between the Schmitt trigger and the resistance network for switching over the resistance network.

In accordance with a concomitant feature of the invention, there is provided a logic circuit connected between the Schmitt trigger and the resistance network for converting the output signal of the Schmitt trigger into an antivalent logic output signal and for switching over the resistance network.

Other features which are considered as characteristic for the invention are set forth in the appended claims.

Although the invention is illustrated and described herein as embodied in an oscillator/demodulator circuit arrangement for an inductive proximity switch, it is nevertheless not intended to be limited to the details shown, since various modifications and structural changes may be made therein without departing from the spirit of the invention and within the scope and equivalents of the claims.

The construction and method of operation of the invention, however, together with additional objects and advantages thereof will be best understood from the following description of specific embodiments when read in connection with the accompanying drawings, in which.

Figure 2:
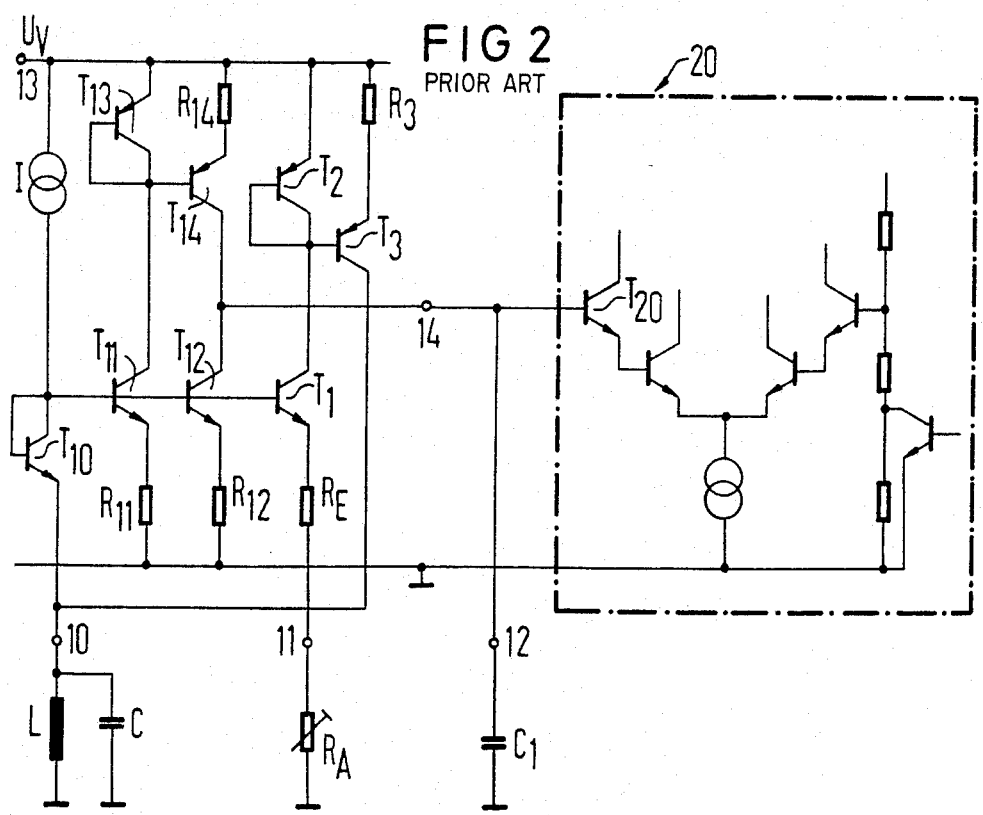
FIG. 2 is a circuit diagram of an embodiment of an oscillator/demodulator circuit according to the invention.
Figure 5:
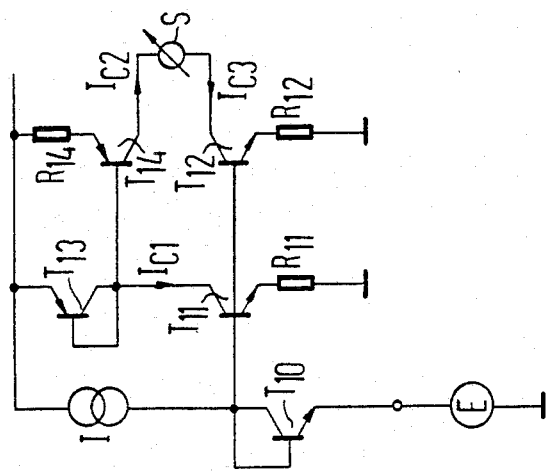
Figure 4:
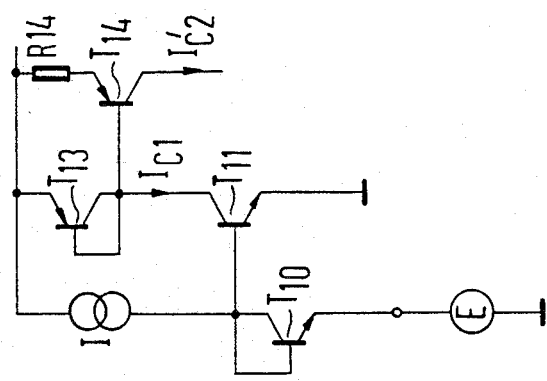
Figure 3:
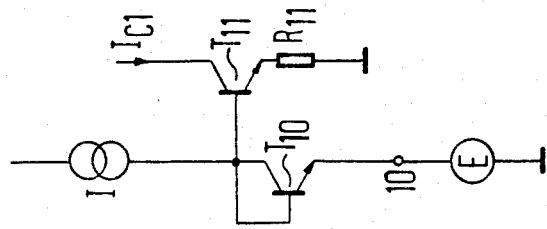
Figure 6:
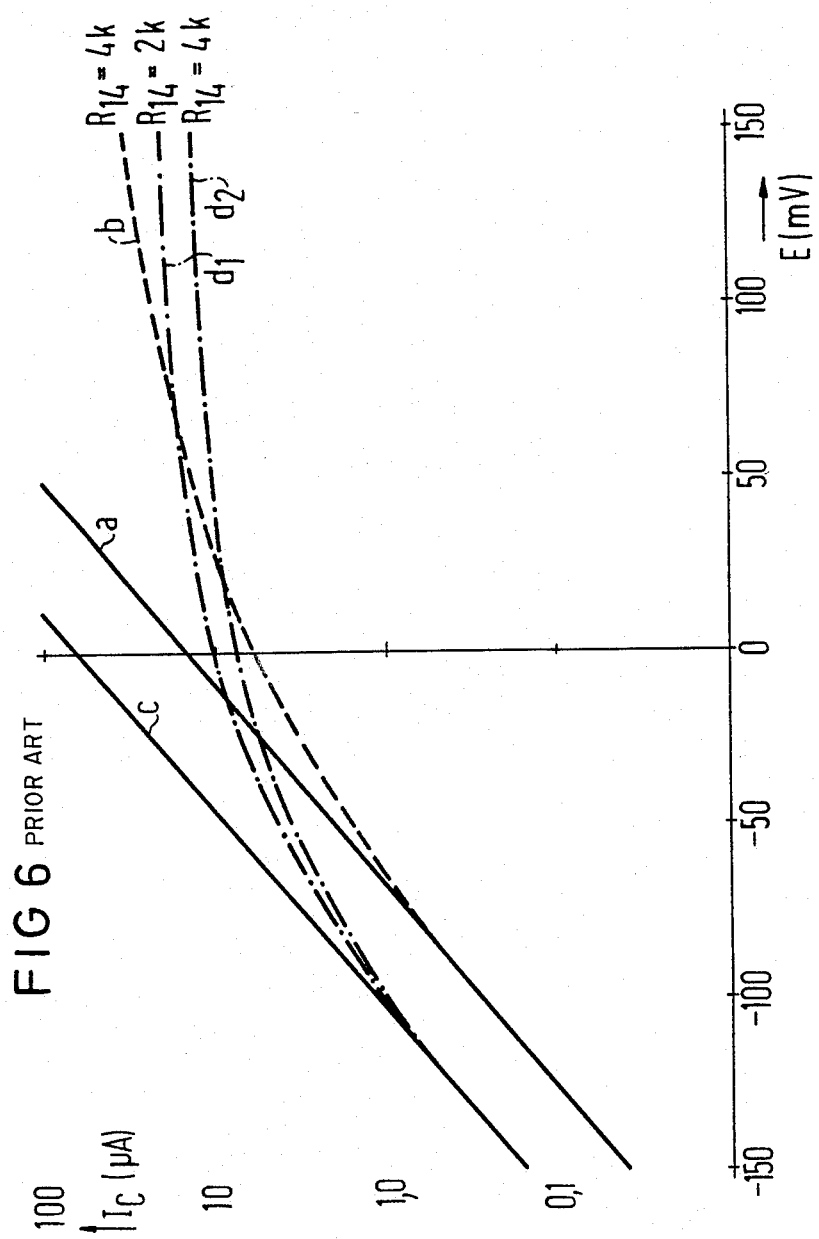
Figure 7:
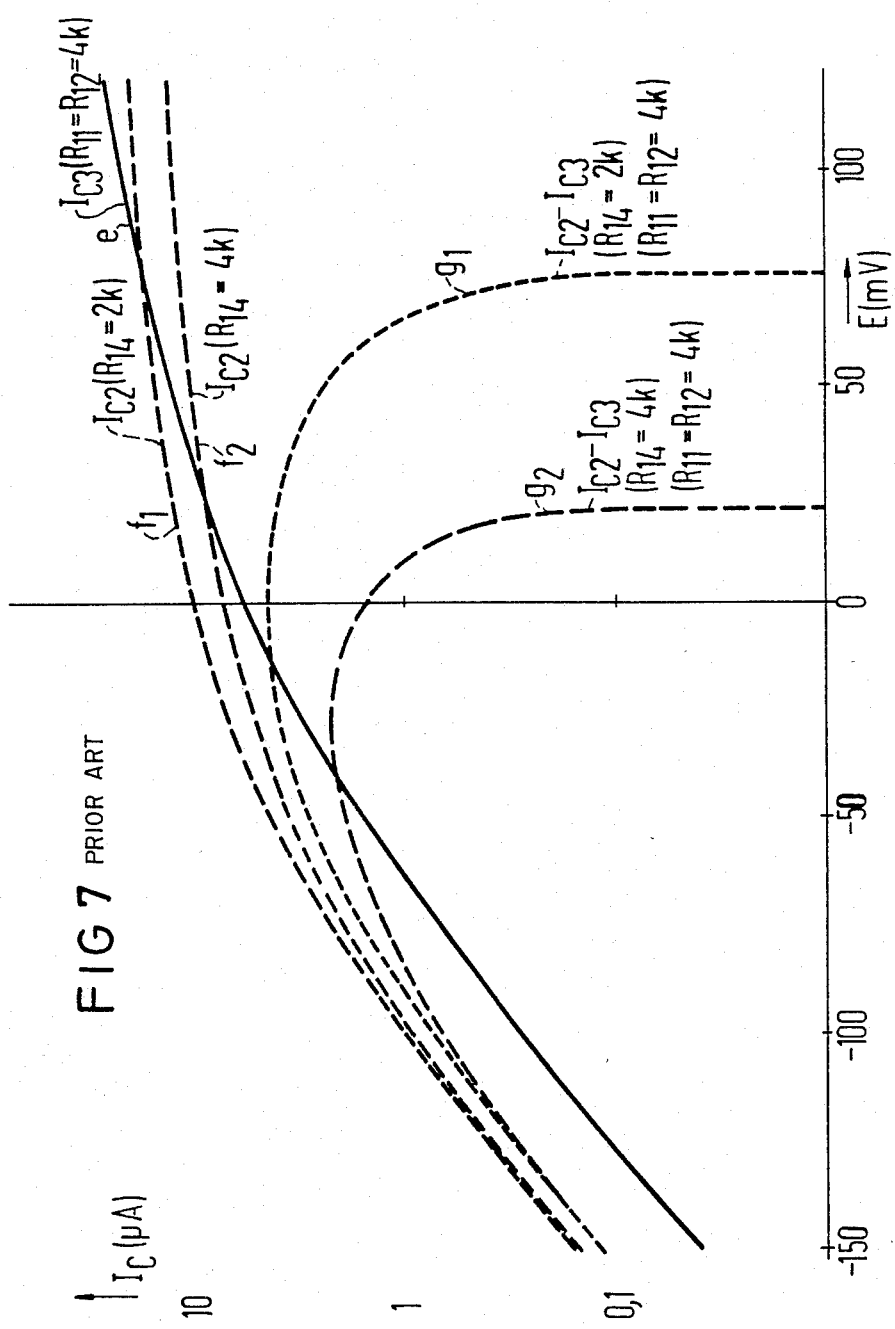
Figure 8:
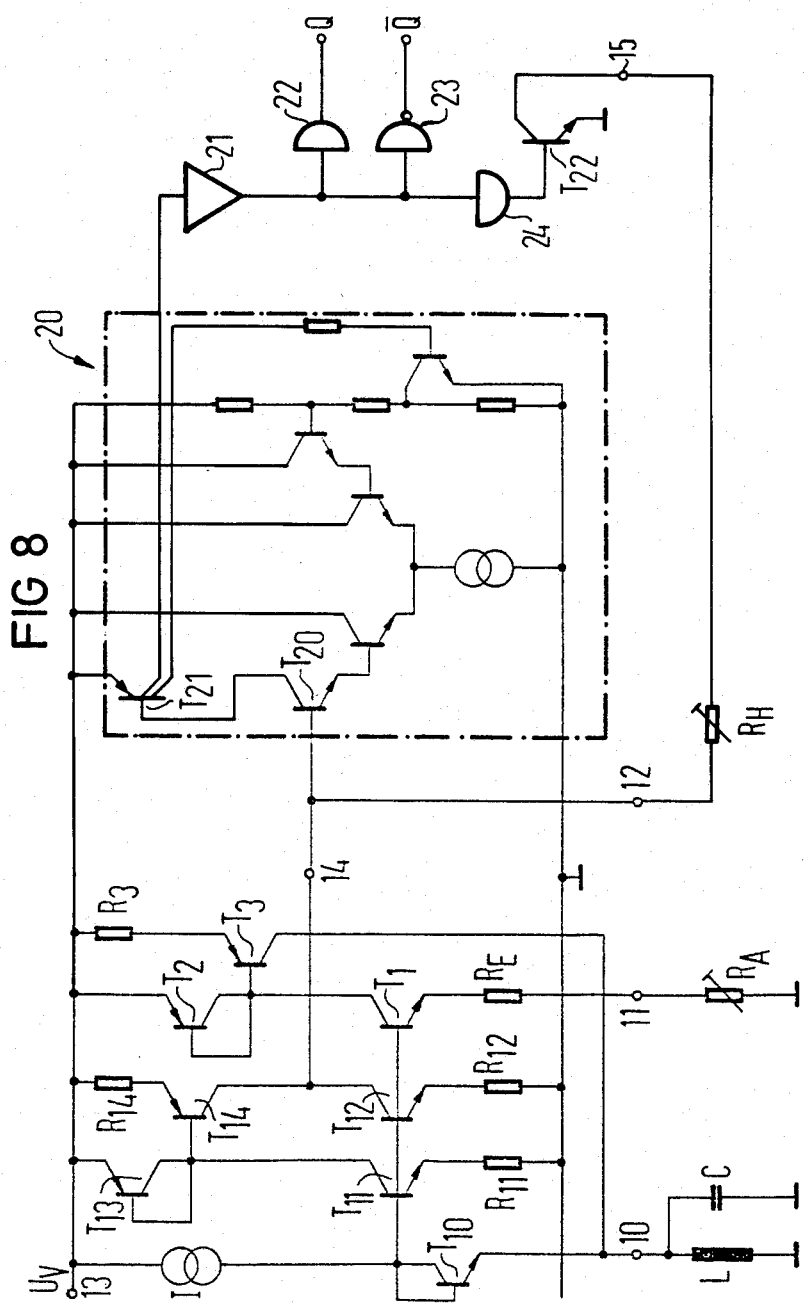

FIGS. 3 to 5 each show a section of a circuit for explaining the operation of the circuit according to FIG. 2;

FIGS. 6 and 7 show current-voltage diagrams which also serve to explain the operation of the circuit according to FIG. 2; and FIG. 8 shows another embodiment of an oscillator/demodulator circuit according to the invention with hysteresis provided in accordance with the invention.

Figure 1:
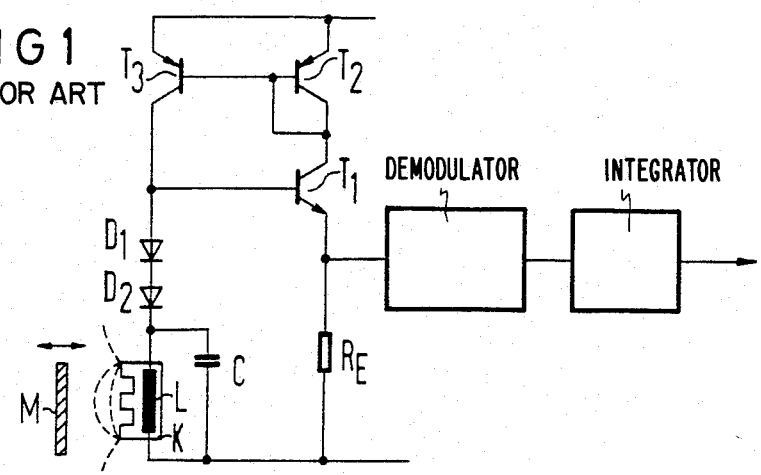
FIG. 1 is a diagrammatic and schematic circuit diagram of an oscillator circuit followed by a demodulator and an integrator, according to the prior art.

Referring now to the figures of the drawings in detail and first, particularly, to FIG. 1 thereof, there is seen an oscillator circuit followed by a demodulator and integrator which has become known, for instance, from the journal "Electronique et Micro-electronique Industrielle", June 15, 1975, pages 54 to 56. The circuit contains a transistor amplifier stage formed of a transistor $T_1$ and an emitter resistor $R_E$ as well as positive feedback provided by a current mirror formed of transistors $T_2$ and $T_3$. The base circuit of the transistor $T_1$ of the amplifier stage is connected to a parallel-resonant circuit formed by a capacitor C and a coil L and the base circuit is also connected to a series circuit of two diodes $D_1$ and $D_2$, in series with the resonant circuit. The coil of the resonant circuit has an open half-shell ferrite core K; an electromagnetic field developed by the coil is indicated diagrammatically by broken lines. If the core K is approached by a metal sheet or a metal vane M, part of the field is absorbed by the metal sheet or vane and the tuned circuit is damped accordingly. The amplitude of the oscillation therefore becomes smaller or the oscillation ceases completely if the loop or circuit gain becomes smaller than 1.

In a circuit for a proximity switch, the oscillator described above is followed by a demodulator and an integrator which are schematically shown in FIG. 1 and need not be discussed further herein.

Swiss Pat. No. 421,237 and corresponding U.S. Pat. No. 3,350,660 disclose a circuit of the kind under discussion, in which a resistor is connected in series with an emitter resistor (corresponding to the resistor $R_E$ in FIG. 1) and this series-connected resistor is switched into and out of the emitter circuit of the oscillator transistor for providing an adjustable range hysteresis by means of an electronic switch as a function of the oscillation state of the oscillator (oscillating or non-oscillating). The gain in the oscillator is increased or decreased depending on whether the series resistor is short-circuited by the electronic switch or is inserted into the emitter circuit, so that switching from the oscillating state to the non-oscillating state of the oscillator (or vice-versa) takes place if a ferromagnetic object approaches from the frequency-determining circuit of the oscillator at different ranges, i.e., a switching hysteresis is provided.

In the circuit according to FIG. 2, elements $T_1$ to $T_3$, $R_E$, L and C correspond to the elements already explained above with regard to the prior art circuit according to FIG. 1. Since the circuit according to the invention is preferably executed in integrated circuit technology, an input terminal 10 is shown as being brought out of the circuit, so that the parallel-resonant circuit L, C can be connected to the terminal 10 externally. The same also applies to teminals 11, 12 and 13 which have been brought out. The terminal 11 can be used for an external connection of a resistor $R_A$ which conventionally serves for setting the switching range (the distance at which the metal sheet or vane M is placed so that the proximity switch switches) as well as for setting the inductive proximity switch containing the oscillator/demodulator circuit according to the invention. In this connection reference is made to the publication mentioned above, in which the prior art circuit according to FIG. 1 is described.

The terminal 12 can be used for an external connection of an integrating capacitor $C_1$, the operation of which will also not be discussed herein in detail, since its operation is known in the art.

A supply voltage $U_V$ can be fed into the circuit at the terminal 13.

The circuit according to FIG. 2 also contains a transistor $T_{10}$ which is connected as a diode, which is supplied by a current source I and which acts, inter alia, as a compensating element for the threshold voltage of the base-emitter path of the transistor $T_1$ forming the amplifier stage of the oscillator/demodulator. To that extent, the operation of this transistor $T_{10}$ which is connected as a diode, corresponds to the operation of one of the diodes in the prior art circuit according to FIG. 1. However, as will be explained in detail below, the function of the transistor $T_{10}$ which is connected as a diode goes beyond the function of the corresponding diode in the prior art circuit according to FIG. 1, so that their operations no longer coincide completely.

In the circuit according to the invention shown in FIG. 2, the transistor $T_{10}$ which is connected as a diode, forms a first current mirror together with two further transistors $T_{11}$ and $T_{12}$.

The emitter branches of the transistors $T_{11}$ and $T_{12}$ contain respective resistors $R_{11}$ and $R_{12}$ connected to ground. The transistor $T_{10}$ which is connected as a diode serves as a reference element for the first current mirror and the two transistors $T_{11}$ and $T_{12}$ with the respective emitter resistors $R_{11}$, $R_{12}$ are addressed jointly at their bases by this reference element. The transistor $T_{10}$ which is connected as a diode and which serves as the reference element, the bases of the transistor $T_{11}$ and $T_{12}$ of the first current mirror as well as the transistor $T_1$ forming the amplifier stage, are connected together; this connection is also referred to above as the "base bus".

The circuit according to the invention shown in FIG. 2 also contains a second current mirror which is formed by a transistor $T_{13}$ which is connected as a diode as well as a transistor $T_{14}$ with a resistor $R_{14}$ connected to the supply voltage in the emitter branch thereof. In the second mirror reflector, the transistor $T_{13}$ which is connected as a diode, forms a reference element which controls the transistor $T_{14}$. In the two current mirrors, the collector-emitter paths of the transistors $T_{11}$ and $T_{13}$ as well as of the transistors $T_{12}$ and $T_{14}$ are respectively connected together in series. The transistors $T_{10}$, $T_{11}$, $T_{12}$ of the first current mirror are of the conduction type opposite to that of the transistors $T_{13}$, $T_{14}$ of the second current mirror. The resistance values of the resistors $R_{11}$, $R_{12}$ in the emitter branches of the controlled transistors $T_{11}$, $T_{12}$ of the first current mirror moreover are larger than the resistance value of the resistor $R_{14}$ in the emitter circuit of the controlled transistor $T_{14}$ in the second current mirror.

The junction point of the collectors of the transistors $T_{12}$ and $T_{14}$ is tied to an output 14 of the oscillator/demodulator circuit according to the invention.

It is evident that the two current mirrors explained above form a dual current mirror which is active in the input circuit of the transistor amplifier stage $T_1$, wherein the currents furnished by current reflectors, i.e., the collector currents of the transistors $T_{12}$ and $T_{14}$ are subtracted at the circuit output 14.

In order to indicate that the oscillator/demodulator circuit according to the invention must furnish a current for following stages in an inductive proximity switch, a Schmitt trigger 20 is also shown schematically in FIG. 2, in which only one input transistor $T_{20}$ is specifically designated. This is a conventional stage and it will therefore not be explained in detail at this point. For the operation of the FIG. 2 device, it is merely important (as opposed to the operation of the circuit shown in FIG. 8) for the oscillator/demodulator circuit to furnish an output current for controlling the transistor $T_{20}$ in the Schmitt trigger, as will be explained in further detail in connection with FIGS. 3 to 7.

In order to explain the operation of the circuit according to the invention, a source E furnishing a variable impressed voltage is assumed to be present at the terminal 10 according to FIG. 3 instead of the resonant circuit L, C according to FIG. 2. For further explanation, it will first be assumed that the transistor $T_{10}$ which is connected as a diode always carries a constant current of 10 $\mu$A, for instance, furnished by the current source For standard structures, a forward voltage of 620 mV is then measured at the transistor $T_{10}$ which is connected as a diode It is furthermore assumed that the transistor $T_{10}$ which is connected as a diode as well as the transistors $T_{11}$, $T_{12}$ and $T_1$ have the same structure. If the voltage supplied by the source E is equal to zero, the transistors $T_{11}$, $T_{12}$ and $T_1$ carry the same current as long as the respective emitter resistors $R_{11}$, $R_{12}$ and $R_E$ are inoperative.

If the voltage furnished by the source E is varied, for instance from $-150$ mV to $+150$ mV, as is shown in the diagram according to FIG. 6, the collector currents of the above-mentioned transistors change in accordance with the diode equation which is known for the base-emitter path of transistors. This relationship is plotted as a straight line a in the diagram of FIG. 6, in which a collector current $I_C$ is plotted logarithmically on the ordinate.

If, however, the emitter resistors are operative, then the course of the collector currents lies below the original curve a in accordance with the curve b. As long as the voltage drop at the emitter resistors remains substantially smaller than about 10mV, the deviation from curve a is barely noticeable. Due to the already mentioned logarithmic diode law, an increase of the base-emitter control voltage by 1 mV always means an increase of the collector current by 4%. However, the larger that the voltage drop becomes at the emitter resistors, the greater the deviation from curve a will be.

As emitter areas of a controlled transistor in a current reflector become larger, for instance by a factor m, the collector current also becomes larger by this very same factor m, as long as an emitter resistor is inoperative. This case is represented by a curve c in the diagram according to FIG. 6. This curve c is exactly parallel to the curve a at a distance m. If the emitter resistor is operative, a deviation from a straight line is obtained for the curve c as in the case of the curves a and b, as is shown by the curves $d_1$ and $d_2$; these two curves apply to different values of the emitter resistance. Especially with an area ratio m of 4, a base-emitter control voltage which is about 36 mV smaller is required for the same collector current as compared with the reference structure. In accordance with the smaller required base-emitter control voltage, the voltage drop at the emitter resistor can be larger for the same collector current. As a consequence, for different values of the emitter resistance, the curves $d_1$ and $d_2$ are bent away from the curve c more than the curve b deviates from the curve a.

The relationships shown in curves a and b respectively correspond to a current mirror as per FIG. 3 and to the current reflector $T_{10}$, $T_{11}$, $T_{12}$ and $T_1$ (also referred to as a "current bank" below)

The relationships represented by the curves c and $d_1$, $d_2$, respectively, correspond to a current mirror according to FIG. 4, or to the current reflector $T_{13}$, $T_{14}$, $R_{14}$ addressed by the collector current of the transistor $T_{11}$ which is designated with reference symbol $I_{c1}$ in FIGS. 3 to 5.

The difference current flowing at the output 14 corresponds approximately to the difference between the curves b and $d_1$, $d_2$ according to FIG. 6. This fact is shown in FIG. 5 in such a manner that the interconnection between the collectors of the transistors $T_{14}$ and $T_{12}$ is visualized as being open and the difference between the respective collector currents designated with reference symbols $I_{c2}$ and $I_{c3}$ is measured by a measuring instrument S. The difference $I_{c2}-I_{c3}$ is shown in the diagram according to FIG. 7 in the form of curves $g_1$ and $g_2$ for the respective curves $d_1$ and $d_2$ in FIG. 6. The currents $I_{c3}$ and $I_{c2}$ are shown in the diagram according to FIG. 7 by curves e, $f_1$ and $f_2$, the curves $f_1$ and $f_2$ again applying to different values of the emitter resistances corresponding to the curves $d_1$ and $d_2$ in FIG. 6. The current is also plotted logarithmically on the ordinate in the diagram according to FIG. 7.

As shown in the diagram according to FIG. 7, the difference current $I_{c2}-I_{c3}$ represented by the curves $g_1$, $g_2$ is positive in the entire region of the plane of the drawing to the left of a respective intersection of the curves $f_1$, $f_2$ and e, i.e., the current $I_{c2}$ coming from the collector of the pnp transistor $T_{14}$ is larger than the collector current $I_{c3}$ of the npn transistor $T_{12}$. In this range, the Schmitt trigger 20 according to FIG. 2 is activated. Above and to the right thereof, the difference current drops steeply and finally changes its sign, so that the Schmitt trigger 20 according to FIG. 2 is deactivated.

The difference current curves $g_1$ and $g_2$ respectively show practically a rectifier characteristic. If the control voltage furnished by the source E according to FIGS. 3 to 5 rises above the respective above-mentioned intersection, the npn transistor $T_{12}$ becomes saturated. Then the relationship in which the base current is equal to the quotient of the collector current and the current gain no longer applies; the base current increases considerably so that the current bank becomes inoperative.

While the impedance at the base bus formed by the bases of the transistors $T_{11}$, $T_{12}$ and $T_1$ which are connected to each other was previously very large (approximately equal to the product of the values of the emitter resistances and the current gain), it becomes smaller by the factor of the current gain for control voltages which are larger than the voltages corresponding to the above-mentioned intersections, according to FIG. 7.

The feedback path of the oscillator/damping circuit according to FIG. 2 is closed by the transistor $T_1$ forming the oscillator amplifier stage and the current reflector $T_2$, $T_3$, $R_3$. Instead of the control signal source E according to FIGS. 3 to 5 assumed for purposes of explanation, the parallel resonant circuit L, C of a proximity switch is present at the input terminal 10, as was explained above. An increase of the voltage at this resonant circuit causes an increasing current through the transistor $T_1$. This current is mirrored through the current mirror $T_2$, $T_3$, $R_3$ and is fed back to the resonant circuit ($R_3$ only has a certain stablizing effect in this case. This current likewise rises The impedance of the resonant circuit again leads to an increase of the voltage, this effect having the same direction of tripping, i.e. involving positive feedback as is required for starting any oscillation.

The circuit according to FIG. 2 contains several current sources and current sinks in the sense as explained above, which are controlled together by the control voltage at the input terminal 10. The transistors $T_{13}$, $T_{14}$ of the second current mirror in this case have different emitter area ratios, where the emitter area ratios of the transistor $T_{13}$ acting as the reference element and the controlled transistor $T_{14}$ are, in particular, equal to 1:4. The transistors $T_{10}$, $T_{11}$ and $T_{12}$ in the first current mirror have the same emitter area ratios or such ratios which are not much different from 1. In particular, the resistances $R_{11}$, $R_{12}$ in the emitter branches of the controlled transistors $T_{11}$, $T_{12}$ in the first current reflector are also larger than the resistor $R_{14}$ in the emitter branch of the transistor $T_{14}$ in the second current mirror.

A current which is equal to the current impressed on the diode-connected transistor $T_{10}$ for a control voltage 0 (with the emitter resistance $R_{11}$ inoperative, flows through the current sink of FIG. 3 formed by the transistors $T_{10}$ and $T_{11}$ (with the same area ratios). The path the output current $I_{c1}$ in FIG. 3 as a function of the input control voltage, corresponds to the curve b in the diagram according to FIG. 6.

According to FIG. 4, this current $I_{cl}$ flows into the current source formed of the pnp transistors $T_{13}$, $T_{14}$ (with different area ratios) The current $I'_{c2}$ supplied by this current source is larger by a factor m than the current $I_{c1}$, if m is the factor by which the emitter area of the transistor $T_{14}$ is larger than that of the transistor $T_{13}$. This is true as long as only a negligibly small voltage drop occurs at the corresponding emitter resistor $R_{14}$. However, due to the voltage drop which is then larger, the current $I_{c2}$ of this current source increases proportionately less steeply for large currents than the current $I_{c3}$ in the transistor $T_{12}$ forming a current sink, according to FIG. 5. This situation is shown in the diagram of FIG. 7 for different values of the resistor $R_{14}$ in the respective curves $f_1$ and $f_2$, which correspond to the curves $d_1$, $d_2$ in FIG. 6. The following circuit in the form of a Schmitt trigger 20 according to FIG. 2, is addressed by the output terminal 14, i.e., by the junction point of the collectors of the transistors $T_{14}$ and $T_{12}$, i.e., the difference between the two collector currents $I_{c2}$ and $I_{c3}$ is available for driving the input transistor $T_{20}$ of the Schmitt trigger 20. As was already explained in conjunction with the diagrams according to FIGS. 6 and 7, the collector current $I_{c2}$ of the current source $T_{14}$ is always larger than the current $I_{c3}$ of the current sink $T_{12}$ for small currents (and therefore for negative values of the control voltage E). The current difference $I_{c2} - I_{c3}$ is therefore always positive for negative control voltages E. The collector current of the transistor $T_{14}$ forming the current source only increases slightly for larger currents, so that the current $I_{c3}$ dominates beginning from a certain value of the control voltage and theoretically, a negative current difference is obtained. As already explained above, the voltage rise at the resonant circuit L, C is limited if the saturation of the transistor $T_{12}$ which acts as a current sink occurs; in this case, the impedance at the base bus of the transistors $T_{11}$, $T_{12}$, $T_1$ then drops, so that the resonant circuit L, C is drastically more heavily loaded (by more than a factor 100) and the gain drops. After the amplitude at the tuned circuit has reached its maximum with this limitation, it drops in the same manner as it had risen before. The energy stored in the tuned circuit has the effect of making the amplitude in the negative direction exactly as large as in the positive direction (a d-c component, i.e., an asymmetry is not possible at the tuned circuit).

The level of the limitation is given by the control voltage at which the difference between the impressed currents $I_{c2} - I_{c3}$ changes its sign. It is determined by the structure of the emitter resistors $R_{11}$, $R_{12}$, $R_{14}$ as well as by the choice of the emitter area ratios in the sense described above.

It is evident from these explanations that the dual current reflector according to the invention simultaneously acts as a demodulator due to the limiting effect according to the curves $g_1$, $g_2$ of FIG. 7.

In connection with the above explanations, it should be pointed out that the term "current mirror" in the conventional sense implies exact proportionality of the currents in all branches. This is likewise fulfilled for small currents in the operational current mirror (curves a and c in FIG. 6). Due to the intended asymmetry in the emitter circuits, transfer functions are consciously obtained which no longer exhibit linearity (curves b and d in FIG. 6). Within the scope of the invention, the term "current mirror" includes this situation.

Due to the construction to the dual current mirror in an oscillator/demodulator circuit according to the invention, a number of advantages are achieved. The limitation (see FIG. 7) is temperature-stable and has values below about 200 mV peak to peak. Furthermore, the loop gain is higher and less scattered.

The impedances at the trimming terminal 11 (external resistor $R_4$ of FIG. 2) can be chosen lower and are scattered less than in the circuit of FIG. 1. Finally, the simultaneously achieved demodulation function is also temperature-stable since no further diode temperature coefficients need be taken into consideration. The demodulation characteristic is steep, which corresponds to a high gain.

FIG. 8 shows the circuit according to FIG. 2 with a structure providing switching hysteresis in accordance with the invention. To the extent that elements in the circuit according to FIG. 2 are provided with the same reference symbols as in FIG. 8, reference is made to the explanations concerning the circuit according to FIG. 2.

In the Schmitt trigger 20, the emitter of a transistor $T_{21}$ is connected to the supply voltage $U_V$ (terminal 13) and the base thereof is connected to the collector-emitter path of the transistor $T_{20}$. The transistor $T_{21}$ has two collectors, one of which is coupled through a resistor without a reference numeral to the base of a transistor without a reference numeral, in the Schmitt trigger 20. Another collector of the transistor $T_{21}$ is brought through an amplifier 21 to inputs of two gates 22 and 23 acting as buffers. An antivalent logic output signal is generated at two outputs Q and $\bar{Q}$ through the two gates 22 and 23. In addition, the output of the amplifier 21 is brought to a further gate 24 which acts as a buffer and has an output controlling an electronic switch In the illustrated embodiment, the electronic switch is a transistor switch $T_{22}$. The collector of the switching transistor $T_{22}$ is brought to the terminal 12 of the circuit through a terminal 15 of the circuit which is brought to the outside, as well as through a variable resistor $R_H$. According to the invention, it is not necessary for the element between the terminals 12 and 15 to be an individual resistor Rather, a resistance network can also be provided which can be switched for changing its overall resistance value. This purpose can be served by an electronic switch such as, for instance, the transistor $T_{22}$.

The operation of the oscillator/demodulator circuit according to FIG. 2 was explained above in detail with the aid of equivalent circuit diagrams according to FIGS. 3 to 5, as well as with the aid of the diagrams according to FIGS. 6 and 7. In the circuit according to FIG. 8, only digital signals are still present at the amplifier 21, which give information regarding the proximity of the metal sheet or vane M according to FIG. 1, and thereby regarding the state of the oscillator (oscillating or non-oscillating).

It is essential for the circuit that in the circuit section ahead of the Schmitt trigger 20, the oscillator and the demodulator are functionally coupled to each other in a non-separable manner so that the relationships: distance/oscillation-amplitude, oscillation-amplitude/demodulator-current, demodulator-current/switching-point, are fixed with respect to circuit and geometry relationships. Furthermore, these relationships are fixed so unambiguously that, by switching the external wiring of the demodulator, an unambiguous relationship of the hysteresis to the distance is provided, i e., a distance hysteresis without observable influence of tolerances or variations of the absolute values of the components or the current gain of transistors. The properties of the demodulator circuit are determined in the embodiment according to FIG. 8 substantially by the adjustable resistor $R_H$ which is either coupled from the circuit output 14 to ground or is inoperative as a function of the output signal of the Schmitt trigger 20, with the switching transistor $T_{22}$ either conducting or cut off. In this way, hysteresis and the distance can be set independently of each other through the resistors $R_A$ and $R_H$. One of the essential advantages of the construction explained above is the fact that the resistor $R_H$ responsible for the hysteresis is not connected into the emitter circuit of the transistor amplifier stage $T_1$, so that no oscillation amplitudes can occur at it and therefore parasitic capacities accompanying them can no longer influence the oscillation behavior of the oscillator.

We claim:

1. Oscillator/demodulator circuit for an inductive proximity switch, comprising a transistor amplifier stage having an input circuit and an output circuit, a resonant circuit connected in said input circuit of said transistor amplifier stage, means for damping said resonant circuit, means for providing positive feedback from said output circuit to said input circuit of said transistor amplifier stage, a limiter branch connected in said input circuit of said transistor amplifier stage, a dual current mirror active in said input circuit of said transistor amplifier stage having first and second interconnected current mirrors including transistors, a circuit output connected to said current mirrors for receiving currents supplied by said current mirrors being subtracted from each other said transistors in said second current mirror having a larger emitter area ratio than said transistors in said first current mirror, and a variable resistance network connected to said oscillator/demodulator circuit output being variable for providing an adjustable hysteresis.

2. Circuit according to claim 1, including a Schmitt trigger having an input connected to said oscillator/demodulator circuit output and an output connected to said resistance network for switching said resistance network as a function of an output signal of said Schmitt trigger.

3. Circuit according to claim 1, including an electronic switch connected to said resistance network for switching said resistance network.

4. Circuit according to claim 2, including an electronic switch connected between said Schmitt trigger and said resistance network for switching said resistance network 5. Circuit according to claim 2, including a logic circuit connected between said Schmitt trigger and said resistance network for converting said output signal of said Schmitt trigger into an antivalent logic output signal and for switching said resistance network.

* * * * *